US009432568B2

(12) United States Patent
Mlinar et al.

(10) Patent No.: US 9,432,568 B2
(45) Date of Patent: Aug. 30, 2016

(54) PIXEL ARRANGEMENTS FOR IMAGE SENSORS WITH PHASE DETECTION PIXELS

(71) Applicant: Semiconductor Components Industries, LLC, Phoenix, AZ (US)

(72) Inventors: Marko Mlinar, Horjul (SI); Brian Keelan, Boulder Creek, CA (US); Douglas Fettig, Meridian, ID (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 62 days.

(21) Appl. No.: 14/319,916

(22) Filed: Jun. 30, 2014

(65) Prior Publication Data
US 2015/0381951 A1 Dec. 31, 2015

(51) Int. Cl.
*H04N 9/083* (2006.01)
*H04N 5/232* (2006.01)
*G06T 11/00* (2006.01)
*H04N 5/369* (2011.01)
*H01L 27/146* (2006.01)
*H04N 9/04* (2006.01)
*H04N 3/14* (2006.01)

(52) U.S. Cl.
CPC ......... *H04N 5/23212* (2013.01); *G06T 11/001* (2013.01); *H01L 27/14621* (2013.01); *H04N 5/3696* (2013.01); *H04N 9/045* (2013.01)

(58) Field of Classification Search
USPC .............. 348/272, 273, 345, 349, 351, 275
See application file for complete search history.

(56) References Cited

U.S. PATENT DOCUMENTS

| 8,730,545 | B2 * | 5/2014 | Endo | H04N 5/23212 |
| | | | | 358/505 |
| 9,106,824 | B2 * | 8/2015 | Endo | H04N 5/23212 |
| 9,106,826 | B2 * | 8/2015 | Aoki | H04N 5/23212 |
| 9,184,195 | B2 * | 11/2015 | Hayashi | H04N 9/045 |
| 2008/0259202 | A1 * | 10/2008 | Fujii | H04N 5/3696 |
| | | | | 348/345 |
| 2012/0043634 | A1 * | 2/2012 | Kurihara | G02B 3/0018 |
| | | | | 257/432 |
| 2012/0193515 | A1 | 8/2012 | Agranov et al. |

(Continued)

OTHER PUBLICATIONS

"Canon Dual Pixel CMOS AF shows us what Olympus-Panasonic will have to do", 4/3 Rumors, Jul. 2, 2013, Retrieved from the Internet:URL:http://www.43rumors.com/canon-dual-pixel-cmos-af-shows-us-what-olympus-panasonic-will-have-to-do/ [retrieved on May 1, 2014].

(Continued)

*Primary Examiner* — Ngoc-Yen Vu
(74) *Attorney, Agent, or Firm* — Treyz Law Group, P.C.; Kendall P. Woodruff; Joseph F. Guihan

(57) ABSTRACT

An image sensor may include a pixel array having image pixels for capturing image data and phase detection pixels for gathering phase information during automatic focusing operations. Phase detection pixels may form phase detection pixel pairs having first and second pixels with different angular responses. The first and second pixels may have color filters of the same color or may have color filters of different colors. The phase detection pixel pairs may be isolated from other phase detection pixel pairs in the array or may be arranged consecutively in a line. The phase detection pixels may, for example, be provided with color filters to match the color filter pattern of the pixel array. Processing circuitry may adjust red and green pixel signals from a phase detection pixel pair having a red and green color filter and may subsequently determine a phase difference using the adjusted pixel signals.

20 Claims, 10 Drawing Sheets

(56) References Cited

U.S. PATENT DOCUMENTS

| | | |
|---|---|---|
| 2013/0038691 A1 | 2/2013 | Agranov et al. |
| 2013/0182173 A1* | 7/2013 | Murata ............. H01L 27/14605 348/349 |
| 2013/0222552 A1 | 8/2013 | Agranov et al. |
| 2013/0271646 A1 | 10/2013 | Hamano |
| 2014/0192248 A1* | 7/2014 | Kishi ................. H04N 5/23212 348/345 |
| 2015/0009383 A1* | 1/2015 | Fujii ..................... H04N 5/347 348/302 |
| 2015/0053846 A1* | 2/2015 | Byun ................ H01L 27/14629 250/208.1 |
| 2015/0146052 A1* | 5/2015 | Sawadaishi .............. G02B 7/34 348/266 |
| 2015/0312461 A1* | 10/2015 | Kim ..................... H04N 5/2353 348/308 |

OTHER PUBLICATIONS

Fettig et al., U.S. Appl. No. 14/267,695, filed May 1, 2014.

* cited by examiner

FIG. 8

FIG. 9

PIXEL ARRANGEMENTS FOR IMAGE SENSORS WITH PHASE DETECTION PIXELS

BACKGROUND

This relates generally to imaging systems and, more particularly, to imaging systems with phase detection capabilities.

Modern electronic devices such as cellular telephones, cameras, and computers often use digital image sensors. Imager sensors (sometimes referred to as imagers) may be formed from a two-dimensional array of image sensing pixels. Each pixel receives incident photons (light) and converts the photons into electrical signals. Image sensors are sometimes designed to provide images to electronic devices using a Joint Photographic Experts Group (JPEG) format.

Some applications such as automatic focusing and three-dimensional (3D) imaging may require electronic devices to provide stereo and/or depth sensing capabilities. For example, to bring an object of interest into focus for an image capture, an electronic device may need to identify the distances between the electronic device and object of interest. To identify distances, conventional electronic devices use complex arrangements. Some arrangements require the use of multiple image sensors and camera lenses that capture images from various viewpoints. Other arrangements require the addition of lenticular arrays that focus incident light on sub-regions of a two-dimensional pixel array. Due to the addition of components such as additional image sensors or complex lens arrays, these arrangements lead to reduced spatial resolution, increased cost, and increased complexity.

Some electronic devices include both image pixels and phase detection pixels in an a single image sensor. With this type of arrangement, a camera can use the on-chip phase detection pixels to focus an image without requiring a separate phase detection sensor. In a typical arrangement, phase detection pixels all have the same color and are arranged consecutively in a line in the pixel array. When phase detection pixels are arranged in this way, optical crosstalk becomes problematic. For example, optical crosstalk between a green image pixel and a green phase detection pixel may be more difficult to correct that optical crosstalk between a green image pixel and a red image pixel.

It would therefore be desirable to be able to provide improved phase detection pixel arrangements and phase detection signal processing methods for image sensors.

BRIEF DESCRIPTION OF THE DRAWINGS

FIG. 8 is a top view of an illustrative pixel array having isolated pairs of stacked phase detection pixels with color filters that match the color filter pattern of the pixel array in accordance with an embodiment of the present invention.

FIG. 9 is a top view of an illustrative pixel array having pairs of stacked phase detection pixels arranged consecutively in a line with color filters that match the color filter pattern of the pixel array in accordance with an embodiment of the present invention.

DETAILED DESCRIPTION

Figure 1:
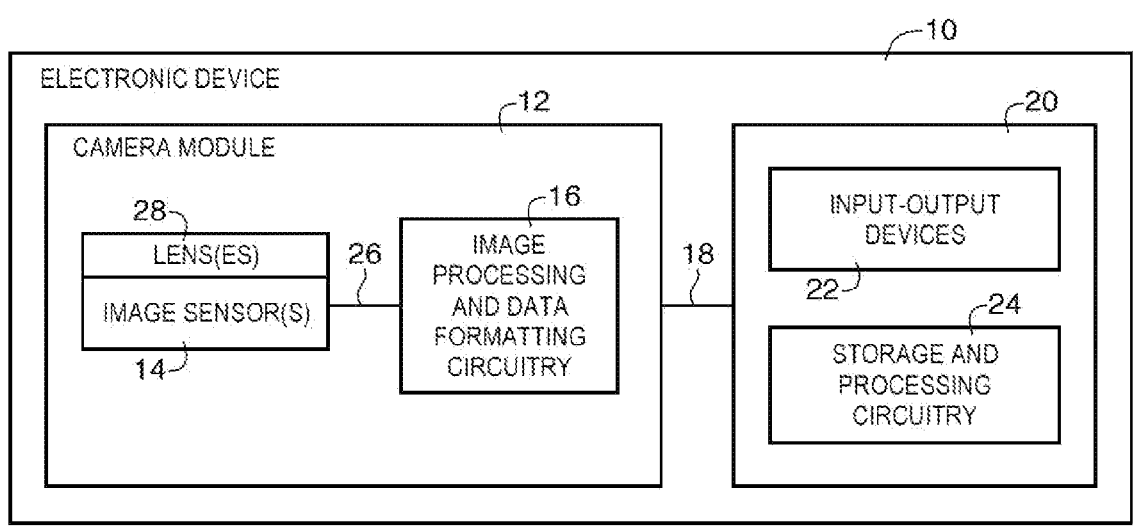
FIG. 1 is a schematic diagram of an illustrative electronic device with an image sensor that may include phase detection pixels in accordance with an embodiment of the present invention.

Embodiments of the present invention relate to image sensors with automatic focusing and depth sensing capabilities. An electronic device with a camera module is shown in FIG. 1. Electronic device 10 may be a digital camera, a computer, a cellular telephone, a medical device, or other electronic device. Camera module 12 (sometimes referred to as an imaging device) may include one or more image sensors 14 and one or more lenses 28. During operation, lenses 28 (sometimes referred to as optics 28) focus light onto image sensor 14. Image sensor 14 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 14 may be provided to image processing and data formatting circuitry 16. Image processing and data formatting circuitry 16 may be used to perform image processing functions such as automatic focusing functions, depth sensing, data formatting, adjusting white balance and exposure, implementing video image stabilization, face detection, etc. For example, during automatic focusing operations, image processing and data formatting circuitry 16 may process data gathered by phase detection pixels in image sensor 14 to determine the magnitude and direction of lens movement (e.g., movement of lens 28) needed to bring an object of interest into focus.

Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common integrated circuit. The use of a single integrated circuit to implement camera sensor 14 and image processing and data formatting circuitry 16 can help to reduce costs. This is, however, merely illustrative. If desired, camera sensor 14 and image processing and data formatting circuitry 16 may be implemented using separate integrated circuits.

Camera module 12 may convey acquired image data to host subsystems 20 over path 18 (e.g., image processing and data formatting circuitry 16 may convey image data to subsystems 20). Electronic device 10 typically provides a user with numerous high-level functions. In a computer or advanced cellular telephone, for example, a user may be provided with the ability to run user applications. To implement these functions, host subsystem 20 of electronic device 10 may include storage and processing circuitry 24 and input-output devices 22 such as keypads, input-output ports, joysticks, and displays. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, or other processing circuits.

It may be desirable to provide image sensors with depth sensing capabilities (e.g., to use in automatic focusing applications, 3D imaging applications such as machine vision applications, etc.). To provide depth sensing capabilities, image sensor 14 may include phase detection pixel groups such as pixel pair 100 shown in FIG. 2A.

Figure 2A:
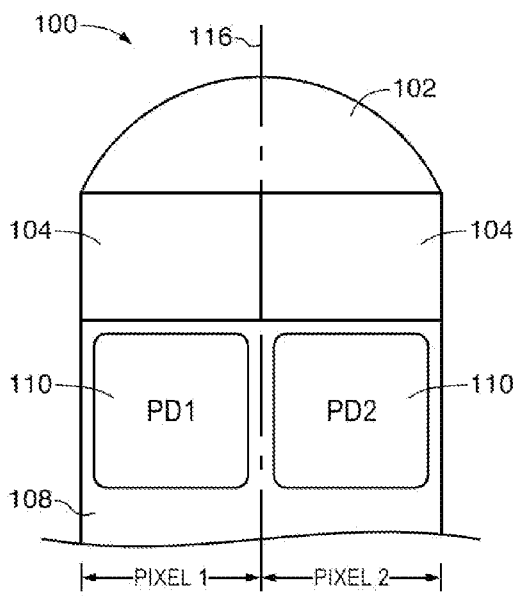
FIG. 2A is a cross-sectional view of illustrative phase detection pixels having photosensitive regions with different and asymmetric angular responses in accordance with an embodiment of the present invention.

FIG. 2A is an illustrative cross-sectional view of pixel pair 100. Pixel pair 100 may include first and second pixels such Pixel 1 and Pixel 2. Pixel 1 and Pixel 2 may include photosensitive regions 110 formed in a substrate such as silicon substrate 108. For example, Pixel 1 may include an associated photosensitive region such as photodiode PD1, and Pixel 2 may include an associated photosensitive region such as photodiode PD2. A microlens may be formed over photodiodes PD1 and PD2 and may be used to direct incident light towards photodiodes PD1 and PD2. The arrangement of FIG. 2A in which microlens 102 covers two pixel regions may sometimes be referred to as a 2×1 or 1×2 arrangement because there are two phase detection pixels arranged consecutively in a line.

Color filters such as color filter elements 104 may be interposed between microlens 102 and substrate 108. Color filter elements 104 may filter incident light by only allowing predetermined wavelengths to pass through color filter elements 104 (e.g., color filter 104 may only be transparent to the certain ranges of wavelengths). Photodiodes PD1 and PD2 may serve to absorb incident light focused by microlens 102 and produce pixel signals that correspond to the amount of incident light absorbed.

Photodiodes PD1 and PD2 may each cover approximately half of the substrate area under microlens 102 (as an example). By only covering half of the substrate area, each photosensitive region may be provided with an asymmetric angular response (e.g., photodiode PD1 may produce different image signals based on the angle at which incident light reaches pixel pair 100). The angle at which incident light reaches pixel pair 100 relative to a normal axis 116 (i.e., the angle at which incident light strikes microlens 102 relative to the optical axis 116 of lens 102) may be herein referred to as the incident angle or angle of incidence.

An image sensor can be formed using front side illumination imager arrangements (e.g., when circuitry such as metal interconnect circuitry is interposed between the microlens and photosensitive regions) or back side illumination imager arrangements (e.g., when photosensitive regions are interposed between the microlens and the metal interconnect circuitry). The example of FIGS. 2A, 2B, and 2C in which pixels 1 and 2 are backside illuminated image sensor pixels is merely illustrative. If desired, pixels 1 and 2 may be front side illuminated image sensor pixels. Arrangements in which pixels are backside illuminated image sensor pixels are sometimes described herein as an example.

Figure 2B:
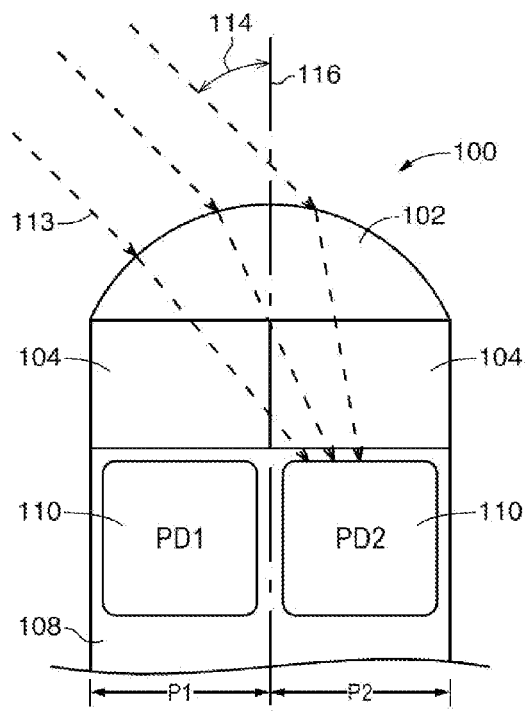
FIGS. 2B and 2C are cross-sectional views of the phase detection pixels of FIG. 2A in accordance with an embodiment of the present invention.

In the example of FIG. 2B, incident light 113 may originate from the left of normal axis 116 and may reach pixel pair 100 with an angle 114 relative to normal axis 116. Angle 114 may be a negative angle of incident light. Incident light 113 that reaches microlens 102 at a negative angle such as angle 114 may be focused towards photodiode PD2. In this scenario, photodiode PD2 may produce relatively high image signals, whereas photodiode PD1 may produce relatively low image signals (e.g., because incident light 113 is not focused towards photodiode PD1).

Figure 2C:
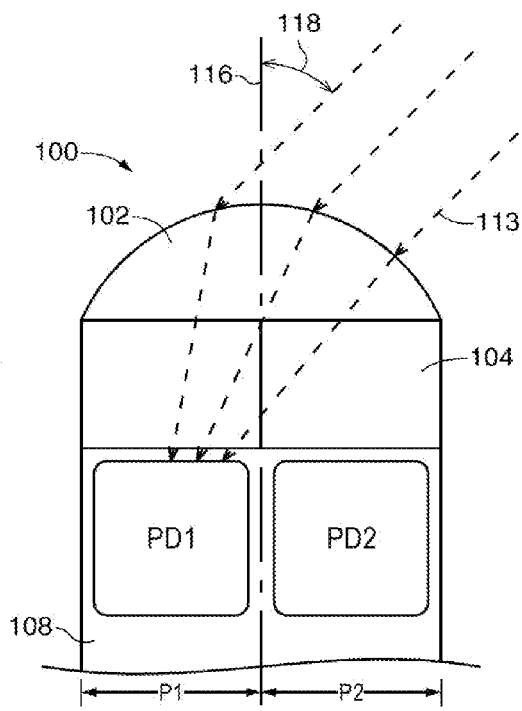

In the example of FIG. 2C, incident light 113 may originate from the right of normal axis 116 and reach pixel pair 100 with an angle 118 relative to normal axis 116. Angle 118 may be a positive angle of incident light. Incident light that reaches microlens 102 at a positive angle such as angle 118 may be focused towards photodiode PD1 (e.g., the light is not focused towards photodiode PD2). In this scenario, photodiode PD2 may produce an image signal output that is relatively low, whereas photodiode PD1 may produce an image signal output that is relatively high.

Figure 3:
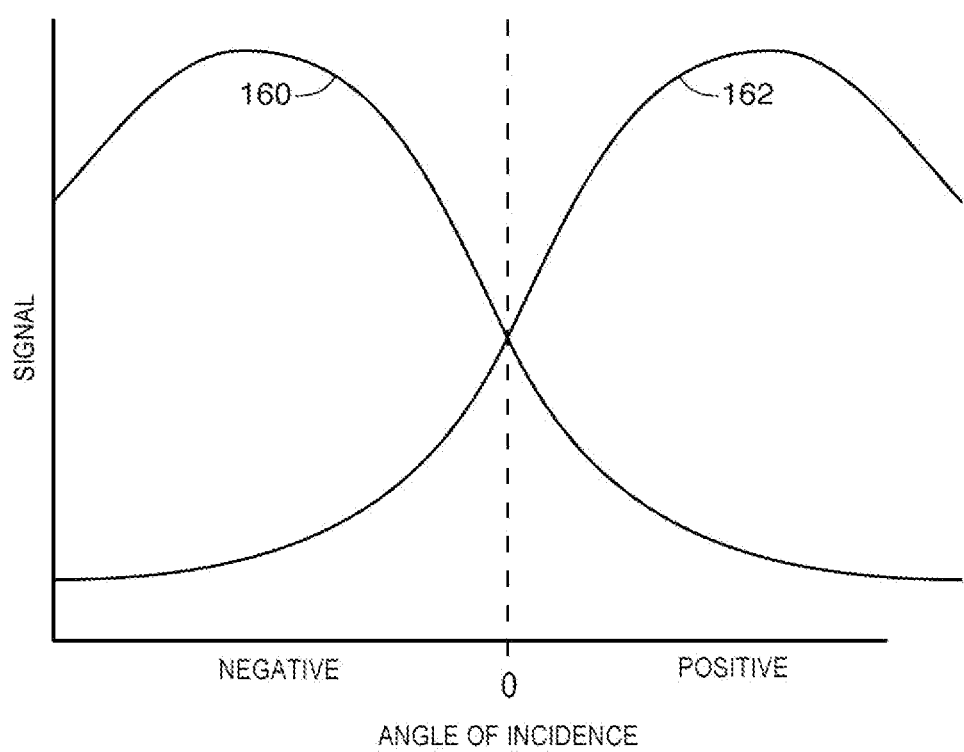
FIG. 3 is a diagram of illustrative signal outputs of phase detection pixels for incident light striking the phase detection pixels at varying angles of incidence in accordance with an embodiment of the present invention.

The positions of photodiodes PD1 and PD2 may sometimes be referred to as asymmetric positions because the center of each photosensitive area 110 is offset from (i.e., not aligned with) optical axis 116 of microlens 102. Due to the asymmetric formation of individual photodiodes PD1 and PD2 in substrate 108, each photosensitive area 110 may have an asymmetric angular response (e.g., the signal output produced by each photodiode 110 in response to incident light with a given intensity may vary based on an angle of incidence). In the diagram of FIG. 3, an example of the pixel signal outputs of photodiodes PD1 and PD2 of pixel pair 100 in response to varying angles of incident light is shown.

Line 160 may represent the output image signal for photodiode PD2 whereas line 162 may represent the output image signal for photodiode PD1. For negative angles of incidence, the output image signal for photodiode PD2 may increase (e.g., because incident light is focused onto photodiode PD2) and the output image signal for photodiode PD1 may decrease (e.g., because incident light is focused away from photodiode PD1). For positive angles of incidence, the output image signal for photodiode PD2 may be relatively small and the output image signal for photodiode PD1 may be relatively large.

The size and location of photodiodes PD1 and PD2 of pixel pair 100 of FIGS. 2A, 2B, and 2C are merely illustrative. If desired, the edges of photodiodes PD1 and PD2 may be located at the center of pixel pair 100 or may be shifted slightly away from the center of pixel pair 100 in any direction. If desired, photodiodes 110 may be decreased in size to cover less than half of the pixel area.

Output signals from pixel pairs such as pixel pair 100 may be used to adjust the optics (e.g., one or more lenses such as lenses 28 of FIG. 1) in image sensor 14 during automatic focusing operations. The direction and magnitude of lens movement needed to bring an object of interest into focus may be determined based on the output signals from pixel pairs 100.

For example, by creating pairs of pixels that are sensitive to light from one side of the lens or the other, a phase difference can be determined. This phase difference may be used to determine both how far and in which direction the image sensor optics should be adjusted to bring the object of interest into focus.

When an object is in focus, light from both sides of the image sensor optics converges to create a focused image. When an object is out of focus, the images projected by two sides of the optics do not overlap because they are out of phase with one another. By creating pairs of pixels where each pixel is sensitive to light from one side of the lens or the other, a phase difference can be determined. This phase difference can be used to determine the direction and magnitude of optics movement needed to bring the images into phase and thereby focus the object of interest. Pixel groups that are used to determine phase difference information such as pixel pair 100 are sometimes referred to herein as phase detection pixels or depth-sensing pixels.

A phase difference signal may be calculated by comparing the output pixel signal of PD1 with that of PD2. For example, a phase difference signal for pixel pair 100 may be determined by subtracting the pixel signal output of PD1 from the pixel signal output of PD2 (e.g., by subtracting line 162 from line 160). For an object at a distance that is less than the focused object distance, the phase difference signal may be negative. For an object at a distance that is greater than the focused object distance, the phase difference signal may be positive. This information may be used to automatically adjust the image sensor optics to bring the object of interest into focus (e.g., by bringing the pixel signals into phase with one another).

Figure 4A:
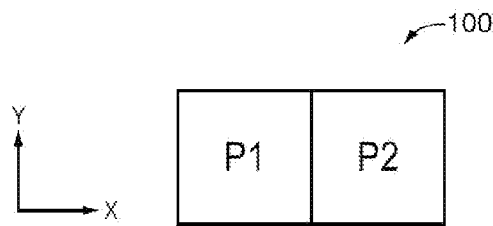
FIG. 4A is a top view of an illustrative phase detection pixel pair arranged horizontally in accordance with an embodiment of the present invention.

Pixel pairs 100 may arranged in various ways. For example, as shown in FIG. 4A, Pixel 1 (referred to herein as P1) and Pixel 2 (referred to herein as P2) of pixel pair 100 may be oriented horizontally, parallel to the x-axis of FIG. 4A (e.g., may be located in the same row of a pixel array).

Figure 4B:
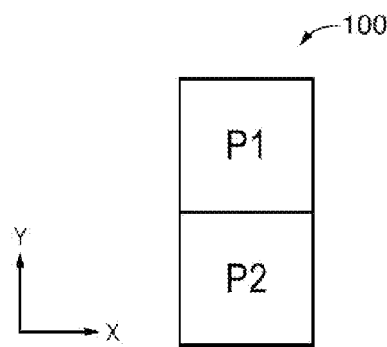
FIG. 4B is a top view of an illustrative phase detection pixel pair arranged vertically in accordance with an embodiment of the present invention.
Figure 4C:
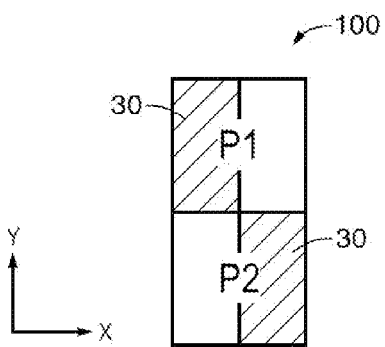
FIG. 4C is a top view of an illustrative phase detection pixel pair arranged vertically and configured to detect phase differences along the horizontal direction in accordance with an embodiment of the present invention.

In the example of FIG. 4B, P1 and P2 are oriented vertically, parallel to the y-axis of FIG. 4B (e.g., in the same column of a pixel array). In the example of FIG. 4C, P1 and P2 are arranged vertically and are configured to detect phase differences in the horizontal direction (e.g., using an opaque light shielding layer such as metal mask 30). Various arrangements for phase detection pixels are described in detail in U.S. patent application Ser. No. 14/267,695, filed May 1, 2014, which is hereby incorporated by reference herein in its entirety.

Figure 5:
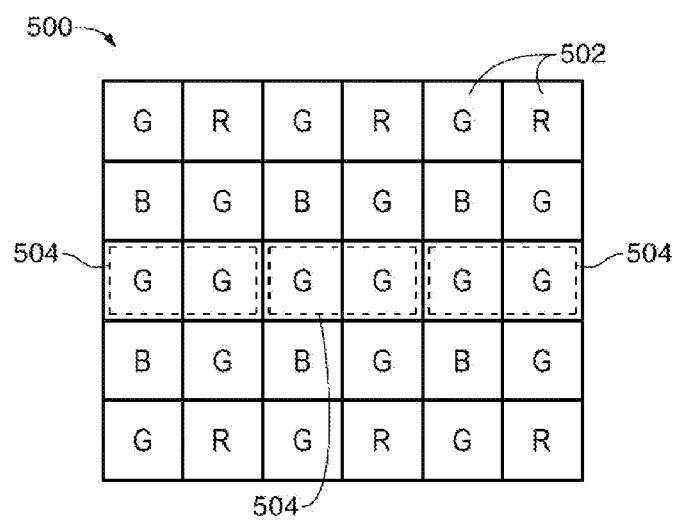
FIG. 5 is a top view of a conventional pixel array having phase detection pixels arranged consecutively in a line and all having the same color.

A typical arrangement for phase detection pixels is shown in FIG. 5. The conventional pixel array 500 of FIG. 5 includes an array of image pixels 502. Phase detection pixel pairs 504 in pixel array 500 are arranged consecutively in a line. Pixel array 500 includes a color filter array. Pixels marked with an R include a red color filter, pixels marked with a G include a green color filter, and pixels marked with a B include a blue color filter. The pattern of color filters in image pixels 502 is a Bayer mosaic pattern which includes a repeating unit cell of two-by-two image pixels 502 having two green image pixels arranged on one diagonal and one red and one blue image pixel arranged on the other diagonal. As shown in FIG. 5, phase detection pixel pairs 504 are all formed with green color filter elements, which disrupts the Bayer mosaic pattern of pixel array 500.

When the color filter pattern is disrupted in this way, replacing phase detection pixel signals with interpolated image pixel values can be challenging. Optical crosstalk between image pixels 502 and 504 can also become problematic, as algorithms that correct for optical crosstalk in pixel arrays with a particular type of color filter pattern are less effective in correcting optical crosstalk when the color filter pattern is disrupted.

To overcome these challenges, phase detection pixels may be arranged such that disruption of the color filter pattern in the pixel array is minimized. Illustrative phase detection pixel arrangements that minimize the amount by which the color filter pattern is altered are shown in FIGS. 6-11. In the examples of FIGS. 6-13, pixels marked with an R include a red color filter, pixels marked with a G include a green color filter, and pixels marked with a B include a blue color filter. Dashed lines such as dashed line 102M may indicate regions that are covered by a single microlens such as microlens 102 of FIG. 2A.

The use of red, green, and blue color filters in FIGS. 6-13 is merely illustrative. If desired, the color filter patterns may include broadband filters. For example, each two-by-two unit of pixels may include one pixel having a broadband filter. In general, any suitable color filter pattern and any suitable type of color filter may be used in image sensor 14. The examples of FIGS. 6-13 are merely illustrative.

Figure 6:
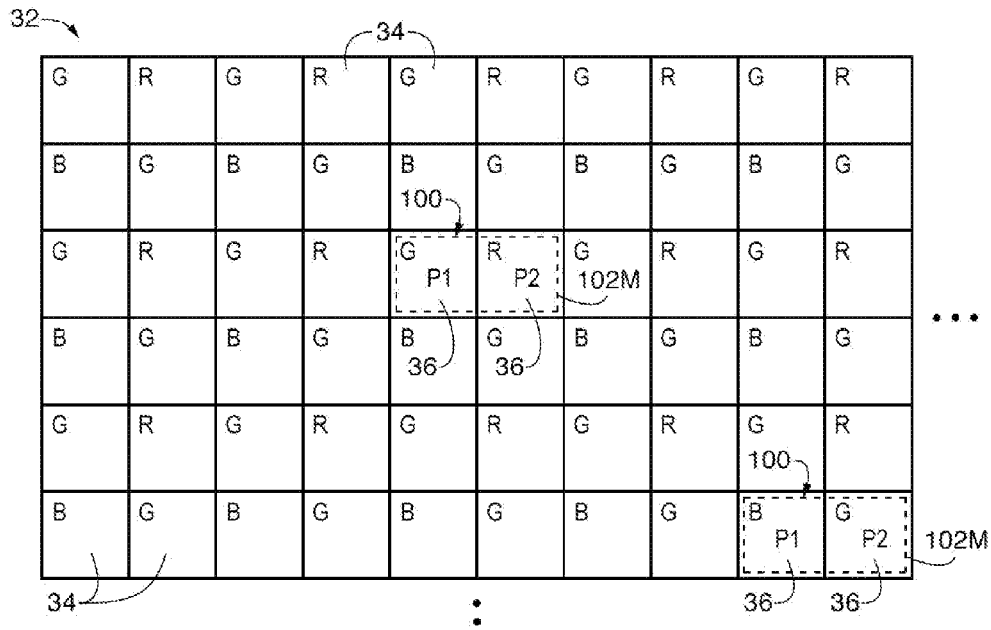
FIG. 6 is a top view of an illustrative pixel array having isolated pairs of phase detection pixels with color filters that match the color filter pattern of the pixel array in accordance with an embodiment of the present invention.

As shown in FIG. 6, pixel array 32 may include image pixels 34 and phase detection pixels 36. Pixel array 32 may include an array of color filter elements such as red color filter elements (e.g., color filter material that passes red light while reflecting and/or absorbing other colors of light), blue color filter elements (e.g., color filter material that passes blue light while reflecting and/or absorbing other colors of light), green color filter elements (e.g., color filter material that passes green light while reflecting and/or absorbing other colors of light), yellow color filter elements (e.g., yellow color filter material that passes red and green light), clear color filter elements (e.g., transparent material that passes red, blue, and green light), broadband filter elements (e.g., filter material that passes two or more colors of light selected from the group that includes red light, blue light, and green light), and/or color filter elements of other colors (e.g., cyan, magenta, etc.).

In the example of FIG. 6, phase detection pixel pairs 100 are formed in a scattered arrangement in which each phase detection pixel pair is isolated from other phase detection pixel pairs. For example, each phase detection pixel pair 100 may be substantially or completely surrounded by image pixels 34. By surrounding phase detection pixel pairs 100 with image pixels 34, replacing the phase detection pixel values with interpolated image pixel values during the image reconstruction process may be facilitated by the greater number of neighboring image pixels 34 around each phase detection pixel pair 100. Scattered phase detection pixel pairs 100 may be oriented horizontally in a row of pixel array 32 (as shown in the example of FIG. 6) or may be oriented vertically in a column of pixel array 32. Pixel array 32 may include one, two, three, ten, less than ten, or more than ten phase detection pixel pairs 100, and the pixel pairs 100 may be positioned at any suitable location in array 32.

Pixel pairs 100 may include color filter elements to match the color filter pattern of image pixels 34. In the example of FIG. 6, image pixels 34 include color filter elements that form a Bayer pattern, and phase detection pixels 36 include color filter elements that do not disrupt the Bayer pattern. For example, P1 of phase detection pixel pair 100 may include a green color filter element and P2 of phase detection pixel pair 100 may include a red color filter element. This is, however, merely illustrative. If desired, P1 may include a red color filter element and P2 may include a green color filter element or P1 may include a blue color filter element and P2 may include a green color filter element (as examples). The color filter elements of P1 and P2 are chosen to match the color filter pattern of the entire pixel array 32.

The example of FIG. 6 in which the color filter pattern of pixel array 32 is a Bayer color filter pattern is merely illustrative. If desired, other suitable patterns of color filters may be used (e.g., pseudo-Bayer color filter patterns in which one or both of the green color filters in each two-by-two unit is replaced with a different type of filter such as a broadband filter, other suitable color filter patterns, etc.). The color filter elements formed in phase detection pixel pairs 36 may be any suitable color so long as the color filter pattern of the pixel array 32 is unchanged. Arrangements in which the color filter pattern of pixel array 32 is a Bayer color filter pattern are sometimes described herein as an example.

Figure 7:
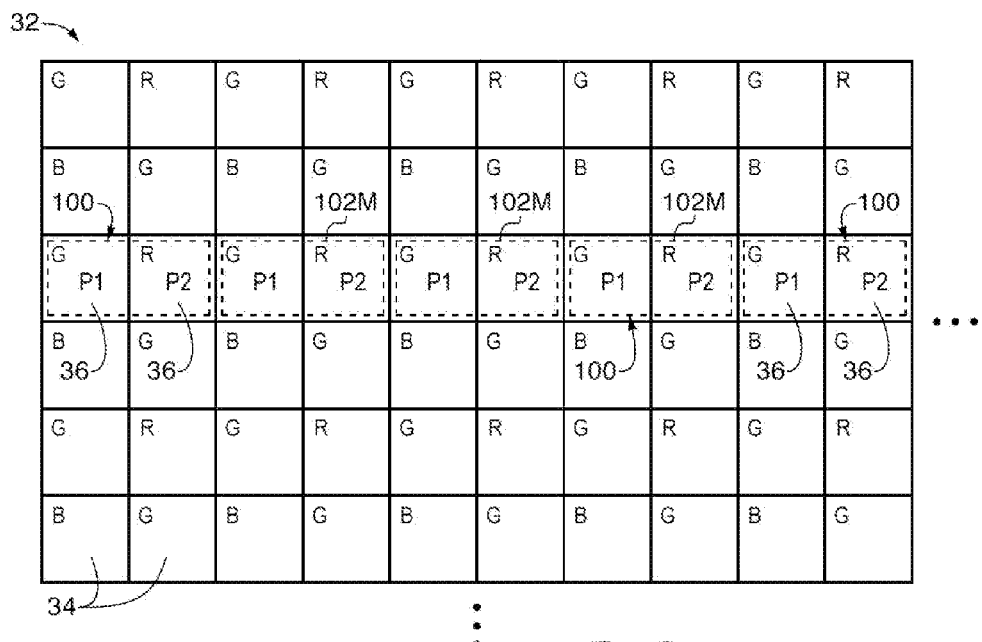
FIG. 7 is a top view of an illustrative pixel array having pairs of phase detection pixels arranged consecutively in a line with color filters that match the color filter pattern of the pixel array in accordance with an embodiment of the present invention.

In the example of FIG. 7, phase detection pixel pairs 100 are arranged consecutively in a line (e.g., a line segment that includes two or more consecutive pixel pairs 100). Phase detection pixel pairs 100 may be arranged horizontally in a row of pixel array 32 (as shown in the example of FIG. 7) or may be arranged vertically in a column of pixel array 32. As with the example of FIG. 6, image pixels 34 of FIG. 7 include color filter elements that form a Bayer pattern, and phase detection pixels 36 include color filter elements that leave the Bayer pattern intact. For example, P1 of each pixel pair 100 may include a green color filter element and P2 of each pixel pair 100 may include a red color filter element. In general, the color filter elements formed in phase detection pixel pairs 36 may be any suitable color so long as the color filter pattern of pixel array 32 is unchanged.

Figures 8, 9:
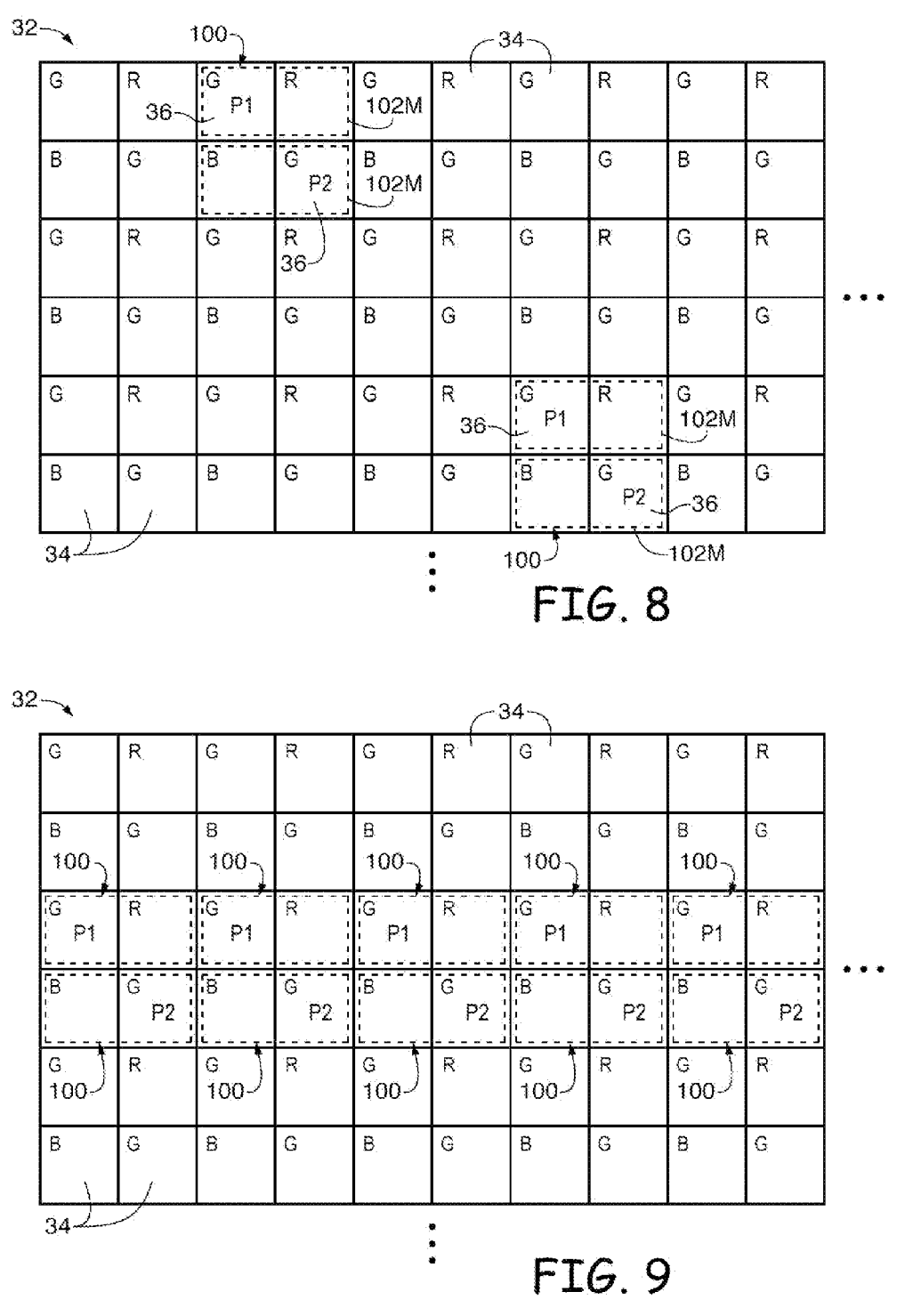

In the example of FIGS. 8, P1 and P2 of each phase detection pixel pair 100 are located diagonally from each other in separate rows and separate columns of pixel array 32. This is sometimes referred to as a stacked phase detection pixel arrangement because the microlens 102 that covers P1 of pixel pair 100 is formed above or below the microlens 102 that covers P2 of pixel pair 100.

As with the example of FIG. 6, phase detection pixel pairs 100 of FIG. 8 are isolated from other phase detection pixel pairs in array 32. For example, each phase detection pixel pair 100 may be substantially or completely surrounded by image pixels 34. By surrounding phase detection pixel pairs 100 with image pixels 34, replacing the phase detection pixel values with interpolated image pixel values during the image reconstruction process may be facilitated by the greater number of neighboring image pixels 34 around each phase detection pixel pair 100.

Image pixels 34 of FIG. 8 include color filter elements that form a Bayer pattern, and phase detection pixels 36 include color filter elements that leave the Bayer pattern intact. However, the stacked arrangement of FIG. 8 allows P1 and P2 of each phase detection pixel pair to be the same color. For example, in cases where the color filter pattern is a Bayer color filter pattern, P1 of each pixel pair 100 may include a green color filter element and P2 (located diagonally from P1) of each pixel pair 100 may also include a green color filter element. In general, the color filter elements formed in phase detection pixel pairs 36 may be any suitable color so long as the color filter pattern of pixel array 32 is unchanged.

In the example of FIG. 9, phase detection pixel pairs 100 having the stacked arrangement of the type shown in FIG. 8 are arranged consecutively in a line (e.g., a line segment that includes two or more adjacent pixel pairs 100). Phase detection pixel pairs 100 may be arranged in two consecutive rows of pixel array 32 (as shown in the example of FIG. 9) or may be arranged in two consecutive columns of pixel array 32. As with the example of FIG. 8, image pixels 34 of FIG. 9 include color filter elements that form a Bayer pattern, and phase detection pixels 36 include color filter elements that leave the Bayer pattern intact. For example, P1 of each pixel pair 100 may include a green color filter element and P2 (located diagonally from P1) of each pixel pair 100 may also include a green color filter element. In general, the color filter elements formed in phase detection pixel pairs 36 may be any suitable color so long as the color filter pattern of pixel array 32 is unchanged.

Figure 10:
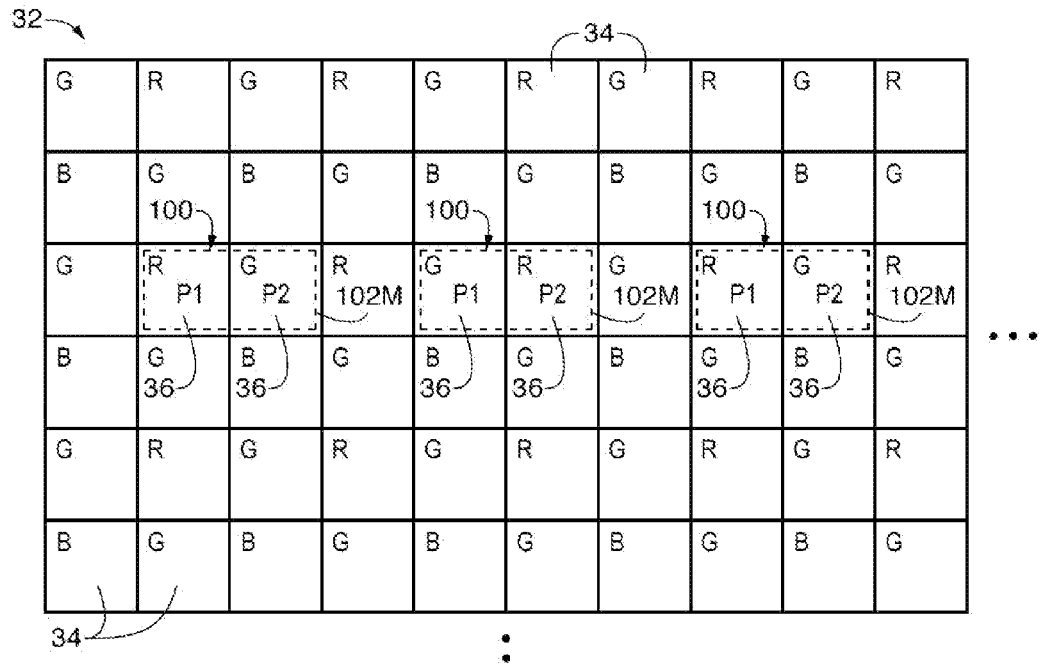
FIG. 10 is a top view of an illustrative pixel array having isolated pairs of phase detection pixels arranged non-consecutively in a line with color filters that match the color filter pattern of the pixel array in accordance with an embodiment of the present invention.

In the example of FIG. 10, pixel pairs 100 are arranged non-consecutively in a line (e.g., are located in a common row) and are isolated from each other by image pixels 34. This type of arrangement is similar to that of FIG. 6 in that each phase detection pixel pair 100 may be substantially or completely surrounded by image pixels 34. By surrounding phase detection pixel pairs 100 with image pixels 34, replacing the phase detection pixel values with interpolated image pixel values during the image reconstruction process may be facilitated by the greater number of neighboring image pixels 34 around each phase detection pixel pair 100.

Figure 11:
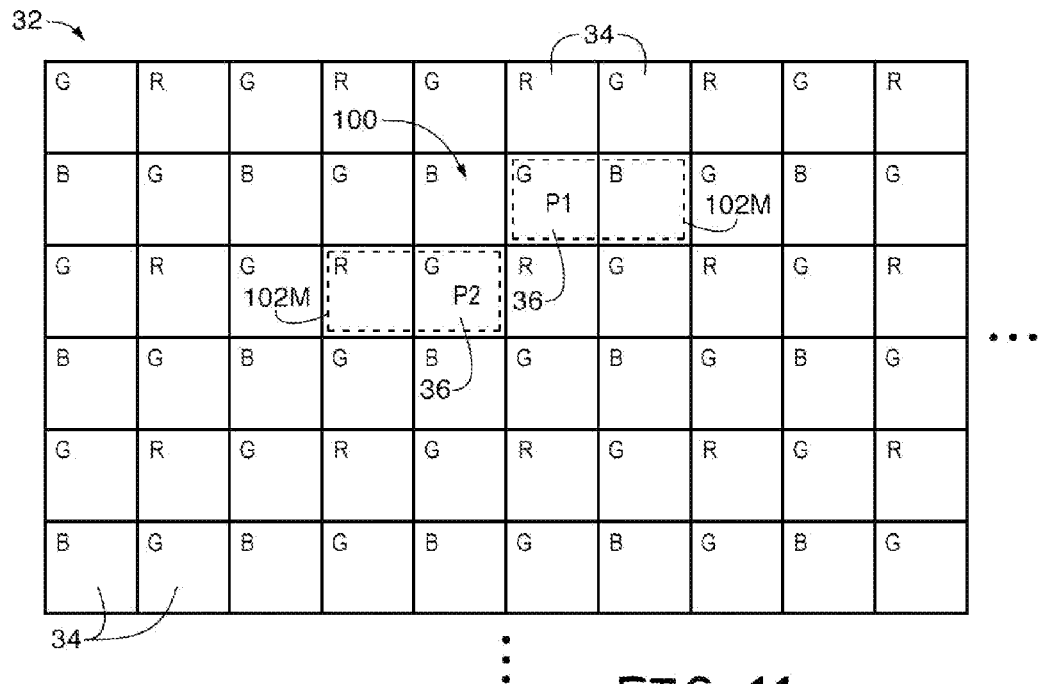
FIG. 11 is a top view of an illustrative pixel array having isolated pairs of diagonally-oriented phase detection pixels with color filters that match the color filter pattern of the pixel array in accordance with an embodiment of the present invention.

FIG. 11 is a variation on the example of FIG. 8 in which P1 and P2 of each phase detection pixel pair 100 are located diagonally from each other in separate rows and separate columns of pixel array 32. In the example of FIG. 11, however, the microlens 102M formed over P1 and the microlens formed over P2 are shifted with respect to one another (e.g., are located diagonally from one another rather than being stacked as in the example of FIG. 8).

Phase detection pixel pairs 100 of the type shown in FIG. 11 may be isolated from other phase detection pixel pairs 100. For example, each phase detection pixel pair 100 may be substantially or completely surrounded by image pixels 34. By surrounding phase detection pixel pairs 100 with image pixels 34, replacing the phase detection pixel values with interpolated image pixel values during the image reconstruction process may be facilitated by the greater number of neighboring image pixels 34 around each phase detection pixel pair 100. This is, however, merely illustrative. If desired, phase detection pixel pairs 100 of the type shown in FIG. 11 may be arranged in a line (e.g., there may be two or more pixel pairs 100 located adjacent to one another along a line).

Image pixels 34 of FIG. 11 include color filter elements that form a Bayer pattern, and phase detection pixels 36 include color filter elements that leave the Bayer pattern intact. However, the arrangement of FIG. 11 allows P1 and P2 of each phase detection pixel pair to be the same color. For example, in cases where the color filter pattern is a Bayer color filter pattern, P1 of each pixel pair 100 may include a green color filter element and P2 (located diagonally from P1) of each pixel pair 100 may also include a green color filter element. In general, the color filter elements formed in phase detection pixel pairs 36 may be any suitable color so long as the color filter pattern of pixel array 32 is unchanged.

Figure 12:
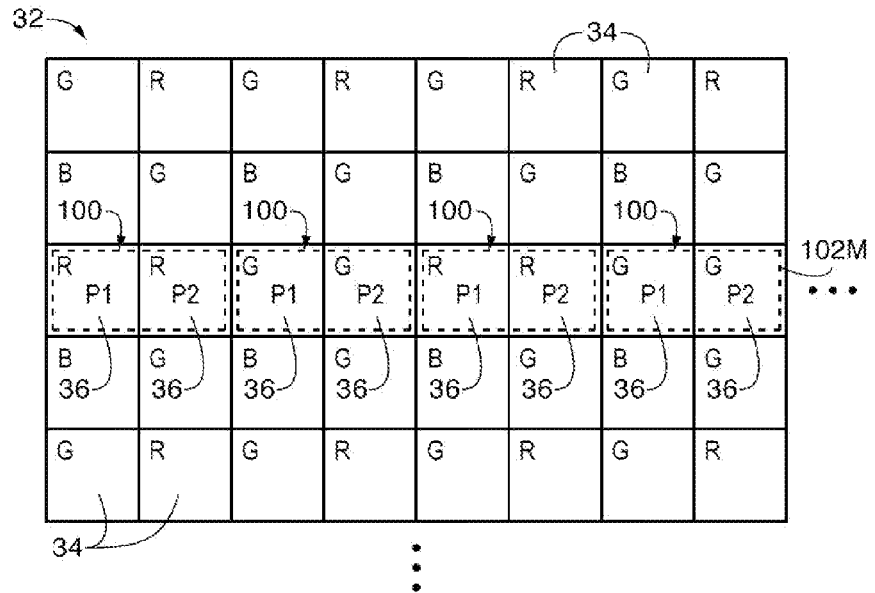
FIG. 12 is a top view of an illustrative pixel array having alternating pairs of red phase detection pixels and green phase detection pixels arranged in a line in accordance with an embodiment of the present invention.
Figure 13:
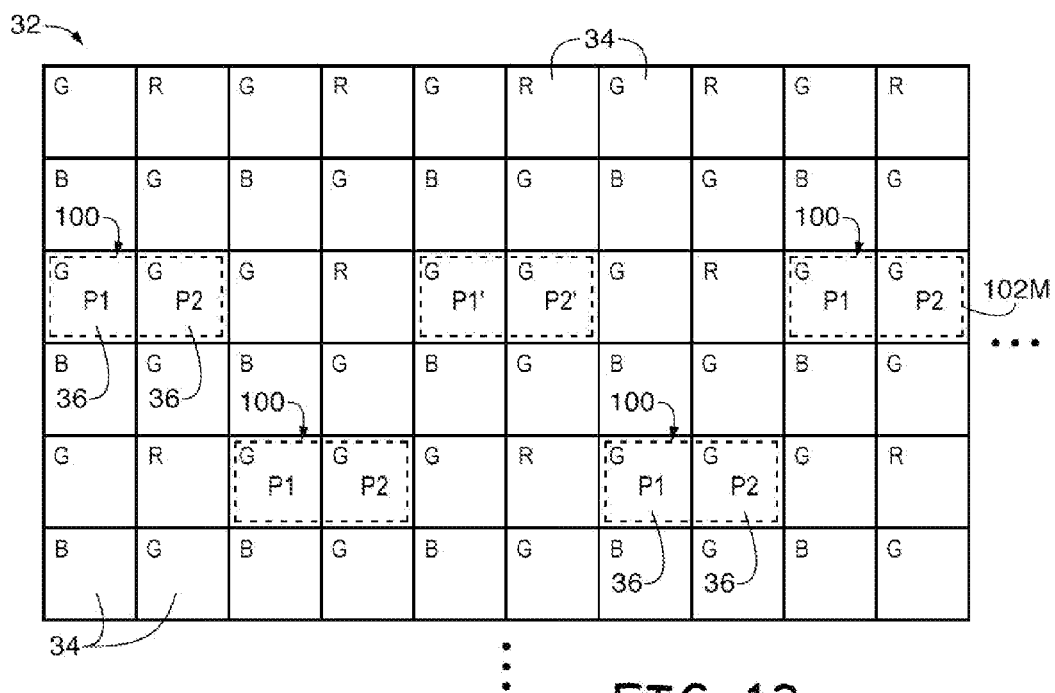
FIG. 13 is a top view of an illustrative pixel array having pairs of green phase detection pixels distributed along two or more pixel rows in accordance with an embodiment of the present invention.

FIGS. 12 and 13 are examples in which the color filter pattern of pixel array 32 is slightly altered by the color filters of phase detection pixels 36. In the example of FIGS. 12, P1 and P2 of a phase detection pixel pair 100 have the same color (e.g., red or green), and the pixel pairs 100 are arranged consecutively in a line (e.g., a line segment that includes two or more adjacent pixel pairs 100). However, unlike the conventional arrangement of FIG. 5, the color of pixel pairs 100 in the line changes from one pair to the next pair. For example, a pair of green phase detection pixels 36 may be interposed between first and second pairs of red phase detection pixels 36. Alternating pairs of green phase detection pixels with pairs of red phase detection pixels in this way may facilitate the image reconstruction process when phase detection pixel values are replaced with interpolated image pixel values. For example, a red image pixel value for a pair of green phase detection pixels may be determined based at least partly on the red pixel values from neighboring red phase detection pixels.

In the example of FIG. 13, phase detection pixels 36 are all the same color but are separated into different rows of pixel array 32. For example, a first row of pixels may include one or more phase detection pixel pairs 100 arranged in a non-consecutive line, whereas a second row of pixels may include one or more phase detection pixel pairs 100 arranged in a non-consecutive line. P1 and P2 of each pixel pair 100 may be the same color such as green (as an example). As shown in FIG. 13, pixel pairs 100 in one row may be staggered with respect to the pixel pairs 100 in another row.

The example of FIG. 13 in which pixel pairs 100 are formed in two rows of pixel array 32 is merely illustrative. If desired, pixel pairs 100 may be formed in more than two rows (e.g., four rows, six rows, etc.). Pixel pairs 100 in each row may be staggered with respect to pixel pairs 100 in the adjacent rows.

If desired, the phase detection pixel values from P1 and P2 may be used during the reconstruction process during which the phase detection pixel values from P1 and P2 are replaced with interpolated image pixel values. Consider P1' and P2' of FIG. 13, for example. To replace the phase detection pixel value P1 from pixel P1' with a green pixel value G and to replace the phase detection pixel value P2 from pixel P2' with a red pixel value R, a green estimate G' may first be determined using the following formula:

$$G'=k(x,y)*(P1+P2) \qquad (1)$$

where k(x,y) is a spatially-dependent coefficient or gain function (e.g., determined during a calibration procedure) that minimizes a predetermined function. For example, the following function may be minimized:

$$\sum_{x,y} \left( \frac{G_1 + G_2}{2} - G' \right)^2 \qquad (2)$$

where $G_1$ and $G_2$ are average green pixel values inside a fixed kernel M×M, and where M is a constant (e.g., M=9). The above function shown in (2) is an illustrative example of a particular function that may be minimized to obtain coefficient k(x,y). If desired, other functions may be used.

Average green pixel values may be determined based on weighted sums of nearby green pixels. After determining a green estimate G', local gradients may be calculated as follows:

$$|G_A-G'|, |G_B-G'|, |G_R-G'|, |G_L-G'| \qquad (3)$$

where $G_A$, $G_B$, $G_R$, and $G_L$ are average green pixel values at a nearby locations above pixels P1' and P2', below pixels P1' and P2', to the right of pixels P1' and P2', and to the left of pixels P1' and P2', respectively.

The missing pixel values R and G are then interpolated based on similarity to neighboring pixels. For example, the missing G value could be set equal to the pixel value of a neighboring green pixel having the smallest associated local gradient. This value may then be used in reconstructing the missing red value R, in a manner similar to that employed in chroma-luma demosaic algorithms. If desired, the output pixel value G may be determined by clipping the green estimate G':

$$G=clip(G',\min(G_A,G_B,G_R,G_L),\max(G_A,G_B,G_R,G_L)) \qquad (4)$$

Figure 14:
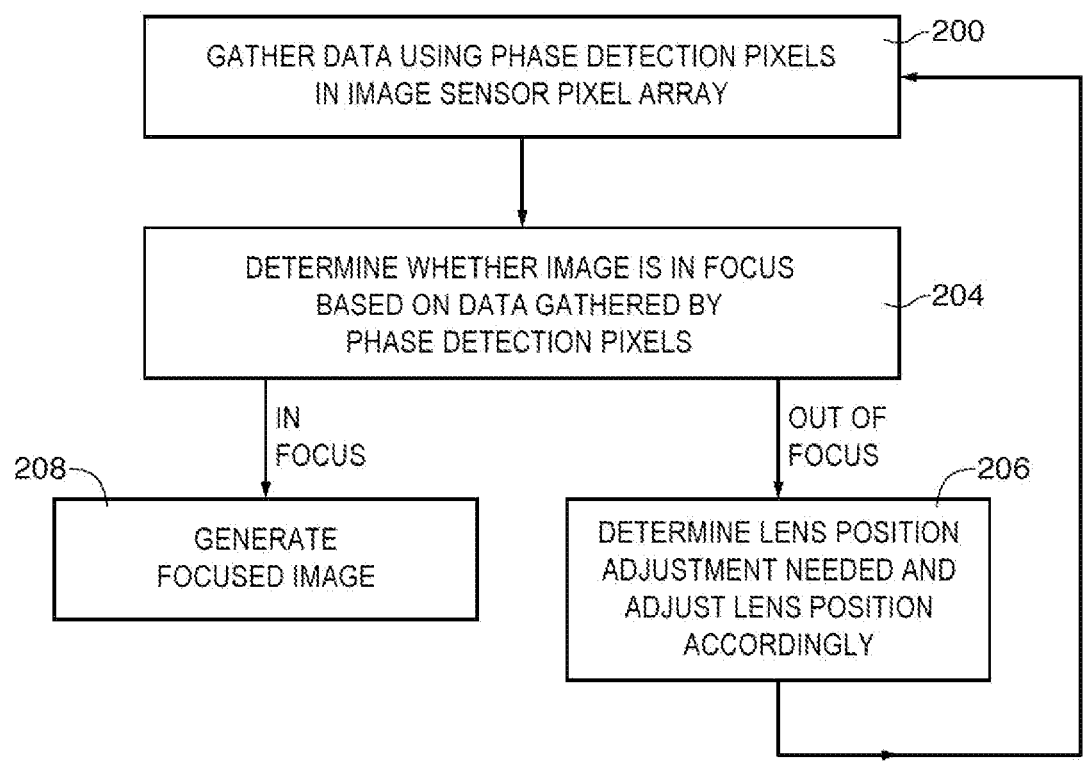
FIG. 14 is a flowchart of illustrative steps involved in operating an image sensor having image pixels and phase detection pixels in accordance with an embodiment of the present invention.

FIG. 14 is a flowchart of illustrative steps involved in operating an image sensor such as image sensor 14 of FIG. 1 having image pixels 34 and phase detection pixels 36.

At step 200, image pixel array 32 may gather data from the light that is focused onto pixel array 32. For example, image pixels 34 may gather image data and phase detection pixels 36 may gather phase information from incoming light. Phase detection pixels 36 may, for example, produce pixel signals of the type shown in FIG. 3. Image data and phase information from image pixels and phase detection pixels may be provided to image processing circuitry 16.

At step 204, processing circuitry 16 may process the gathered phase information and image data to determine whether one or more objects in the image are in focus. In one suitable arrangement, a user of electronic device 10 may select an object of interest in the imaged scene (sometimes referred to as an interest point) and processing circuitry 16 may determine whether the object of interest is in focus. In another suitable arrangement, processing circuitry 16 may autonomously identify objects of interest (interest points) in the imaged scene such as a face, a person, a moving object, or any other desired object using the image data captured by image pixels 34 and the phase information captured by phase detection pixels 36. For example, processing circuitry 16 may implement a face detection algorithm to automatically detect faces in an imaged scene and to identify those faces as interest points. Processing circuitry 16 may determine whether the identified object of interest is in focus (e.g., using the phase data gathered by phase detection pixels 36).

For example, processing circuitry 16 may determine whether objects in the imaged scene are in focus by comparing angular pixel outputs from P1 and P2 of a phase detection pixel pair such as outputs of the type shown in FIG. 3. The algorithm used by processing circuitry 16 to determine a phase difference associated with phase detection pixel signals depends on how phase detection pixels are arranged in the array. For conventional arrangements of the type shown in FIG. 5 in which phase detection pixels are all the same color and are arranged consecutively in a line, a cross-correlation algorithm is used to determine a phase difference. A similar cross-correlation algorithm may be used to process phase detection pixel signals from phase detection pixels having an arrangement of the type shown in FIG. 9.

In arrangements of the type shown in FIG. 10 in which phase detection pixel pairs 100 are arranged non-consecutively in a row and include P1 and P2 of different colors, a modified cross-correlation algorithm may be used. For example, the processing circuitry 16 may perform a first cross-correlation algorithm using pixel signals from red phase detection pixels in the row and a second cross-correlation algorithm using pixel signals from green phase detection pixels in the row. The red data cross-correlation results may be merged with the green data cross-correlation results to determine a phase difference.

In arrangements of the type shown in FIG. 7 in which phase detection pixel pairs 100 are arranged consecutively in a line (e.g., a line segment that includes two or more adjacent pixel pairs 100), again a modified cross-correlation algorithm may be used. However, rather than performing a separate cross-correlation operation for each color channel (as described above), the cross-correlation operation may be performed between colors. This may include, for example, normalizing the line of pixel data from pixel pairs 100 and subsequently adjusting the normalized pixel signals to reduce any bias between pixel signals from red phase detection pixels and pixel signals from green phase detection pixels. For example, pixel data from red phase detection pixels may be adjusted using predetermined correction factors or using pixel signals from nearby phase detection pixels in essentially uniform areas so that the red pixel data becomes comparable to the green pixel data. After minimizing the difference in signal levels from red and green phase detection pixels, a cross-correlation algorithm may be performed to determine a phase difference.

In arrangements of the type shown in FIGS. 6, 8, 11, 12, and 13, a different algorithm may be used whereby a brightness gradient (sometimes referred to as edge polarity) associated with an edge in an image is inferred based on pixel signals from nearby pixels (e.g., nearby image pixels 34 and/or nearby phase detection pixels 36). This type of algorithm is sometimes referred to as edge polarity inference and is described in greater detail below in connection with FIG. 15.

If processing circuitry 16 determines that the image is not in focus (e.g., that the objects of interest in the imaged scene are not in focus), processing may proceed to step 206 to adjust the focus of lens 28 (FIG. 1). This may include, for example, determining a direction (and magnitude, if desired) of lens movement needed to bring the image into focus. Processing may then loop back to step 200 so that processing circuitry 16 can determine whether or not the scene or objects of interest are in focus when captured using the new focal length.

If processing circuitry 16 determines in step 204 that the image is in focus, processing may proceed to step 208.

At step 208, processing circuitry 16 may generate a focused image using the image data captured by imaging pixels 34. This may include, for example, replacing the phase detection pixel values with interpolated image pixel values using pixel values from nearby image pixels 34 (e.g., image pixels 34 in the vicinity of phase detection pixels 36). If desired, phase detection pixel values may be replaced with pixel values that are interpolated using other phase detection pixels (e.g., for arrangements of the type shown in FIG. 12). The image reconstruction process may include, for example, using formulas 1, 2, 3, and 4 as described above in connection with FIG. 13 to interpolate the missing pixel values for phase detection pixels 36.

Processing circuitry 16 may perform additional image processing operations on the focused image in step 208 (e.g., white balance operations, noise correction operations, gamma correction operations, etc.). If desired, processing circuitry 16 may store the focused image in memory and/or convey the focused image to additional processing circuitry or display equipment. In this way, phase detection pixels 36 may generate data that is used to automatically adjust the position of lens 28 to bring one or more objects of interest into focus. If desired, phase detection pixels 36 may be used to generate range information such as one or more depth maps or other three dimensional information about an imaged scene.

Figure 15:
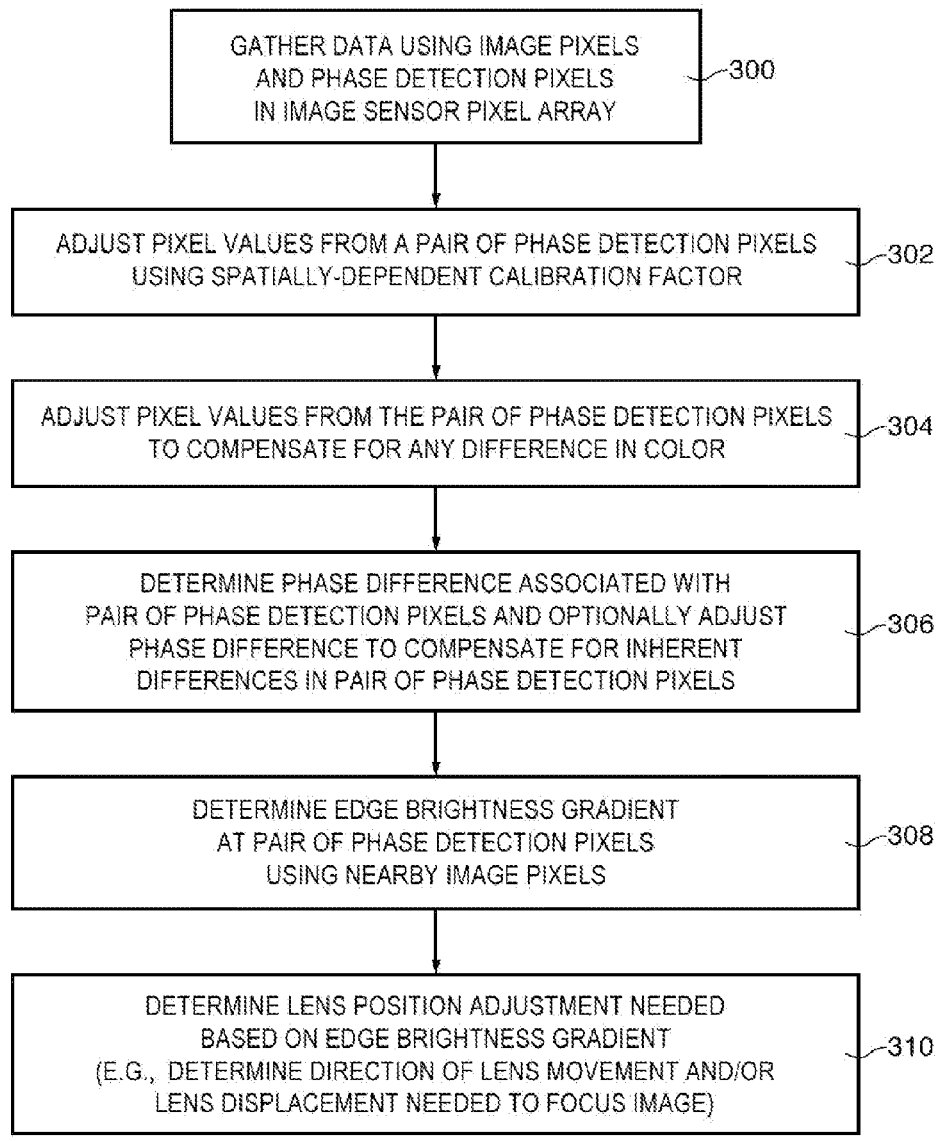
FIG. 15 is a flowchart of illustrative steps involved in processing phase detection pixel signals during automatic focusing operations in accordance with an embodiment of the present invention.

FIG. 15 is a flowchart of illustrative steps involved in processing phase detection pixel signals during automatic focusing operations when phase detection pixels are isolated (e.g., not arranged consecutively to form a substantial line segment). Pixels P1 and P2 of a phase detection pixel pair 100 may be different colors or may be the same color.

At step 300, phase detection pixels 36 (e.g., P1 and P2 of FIG. 6, 8, 11, 12, or 13) may gather phase information from a scene. Phase detection pixel signals from P1 and P2 may be provided to processing circuitry 16.

At step 302, processing circuitry 16 may optionally adjust the pixel values from P1 and P2 using a spatially-dependent calibration factor (e.g., $k(x,y)$ of equation 1) The spatially-dependent calibration factor may be used to map phase detection pixel values from phase detection pixels P1 and P2 to adjusted pixel values that correspond to pixel values that would be produced by P1 and P2 if P1 and P2 were normal image pixels (as opposed to pixels with asymmetric angular responses).

At step 304, processing circuitry 16 may optionally determine and apply a color adjustment to compensate for differences in color between P1 and P2. For example, processing circuitry 16 may adjust pixel values from P1 and P2 based on white balance gains and/or based on other information.

At step 306, processing circuitry 16 may determine a phase difference associated with the pixel values from phase detection pixels P1 and P2. For example, processing circuitry may determine a phase difference $P_D$ by subtracting P1 from P2, where P1 and P2 are pixel signals from phase detection pixels P1 and P2.

Step 306 may optionally include a compensation operation whereby the phase difference $P_D=P1-P2$ is corrected to compensate for inherent signal differences between P1 and P2. For example, pixels P1 and P2 may produce different signals when P1 and P2 of a phase detection pixel pair 100 are different colors. P1 and P2 may also produce different signals even when P1 and P2 are the same color as a result of manufacturing variations, color filter material mismatch, and/or quantum efficiency differences (e.g., resulting from optical crosstalk from image pixels 34 to phase detection pixels 36).

To perform the optional compensation operation, processing circuitry 16 may look for phase detection pixels in nearby "flat" regions. For example, a pixel pair 100 in a flat region (e.g., a region without edges) may include phase detection pixels $P1_f$ and $P2_f$. Since the region is flat, processing circuitry 16 assumes that $P1_f = P2_f$ regardless of focus. Processing circuitry 16 may then determine a bias value bias(x,y) using $P1_f$ and $P2_f$ in the flat region:

$$\text{bias}(x, y) = \frac{P1_f - P2_f}{P1_f + P2_f}, \quad (5)$$

$$\text{when } |(\vec{\nabla})_G| < th_{bias}$$

where $\vec{\nabla}_G$ is a gradient and $th_{bias}$ is a fixed value characteristic of the imaging system and $P1_f$ and $P2_f$ are pixel signals from $P1_f$ and $P2_f$, respectively. The corrected phase difference $P_D'$ can then be calculated in the following way:

$$P_D' = (P1 - P2) - \text{bias}(x,y) * (P1 + P2) \quad (6)$$

At step 308, processing circuitry 16 may determine a brightness gradient associated with an edge at phase detection pixels 36 (e.g., an edge that is perpendicular to an axis passing through P1 and P2). The brightness gradient of the edge may be determined using pixel values from nearby image pixels 34. For example, a gradient may be determined as $\vec{\nabla}_G = (\nabla_x, \nabla_y)$ if and only if the following is true $$\nabla_x > th_1, \nabla_y < th_2 * \nabla_x$$

$$P1 - P2 > \nabla_x * (th_3 + th_4) \quad (7)$$

where $th_1$, $th_2$, $th_3$, and $th_4$ are fixed values characteristic of the imaging system, $\nabla_x$ is a brightness gradient along a horizontal direction in the pixel array, $\nabla_y$ is a brightness gradient along a vertical direction in the pixel array, and P1 and P2 are pixel signals from phase detection pixels P1 and P2.

At step 310, processing circuitry 16 may use the edge brightness gradient determined in step 308 to determine the direction and, if desired, the magnitude of lens movement needed to bring the object of interest into focus. For example, the following autofocus (AF) logic may be used to determine the direction of movement needed (if any):

$$\text{sign}(\nabla_x) * (P1 - P2) < 0 \text{ move closer}$$

$$\text{sign}(\nabla_x) * (P1 - P2) > 0 \text{ move farther}$$

$$\text{sign}(\nabla_x) * (P1 - P2) = 0 \text{ in focus} \quad (8)$$

Lens displacement may be approximated using the following formula:

$$\text{lens\_displacement} \cong f\left(\frac{P1 - P2}{\nabla_x}\right) \quad (9)$$

where f is a function of the lens system.

Various embodiments have been described illustrating image sensor pixel arrays having image pixels for capturing image data and phase detection pixels for gathering phase information during automatic focusing operations. Phase detection pixels may form phase detection pixel pairs having first and second pixels with different angular responses (e.g., inverted, approximately inverted, or complementary angular responses). The first and second pixels may have color filters of the same color or may have color filters of different colors. The phase detection pixel pairs may be isolated from each other (e.g., may be partially or completely surrounded by image pixels) or may be arranged consecutively in a line.

The phase detection pixel pairs may be arranged in an image pixel array having a plurality of image pixels. The image pixel array may include a color filter array having a particular color filter pattern. The phase detection pixels may be provided with color filters to match the color filter pattern of the image pixel array. In other embodiments, the phase detection pixels may be provided with color filters that slightly alter the color filter pattern but that are patterned to facilitate the image reconstruction process in which the phase detection pixel signals are replaced with pixel signals.

Processing circuitry may be used to determine a phase difference associated with pixel signals from a phase detection pixel pair. The processing circuitry may adjust the pixel signals to reduce any bias between the phase detection pixel signals. For example, the processing circuitry may adjust the phase detection pixel signals using spatially-dependent predetermined correction factors. In another suitable embodiment, the processing circuitry may adjust the phase detection pixel signals using a bias value that is determined during image capture operations. The bias value may be determined using nearby phase detection pixels. For example, the processing circuitry may use phase detection pixels in a flat region of an image to determine a bias value which is then used to reduce any bias between the phase detection pixel signals that are being used for autofocus operations.

Processing circuitry may replace phase detection pixel values with interpolated image pixel values during an image reconstruction process. The interpolated image pixel values may be determined based on a brightness gradient. The brightness gradient may be determined using nearby image pixels. For example, to replace a green phase detection pixel value with a green image pixel value, a local brightness gradient may be determined using nearby green image pixels.

The foregoing is merely illustrative of the principles of this invention and various modifications can be made by those skilled in the art without departing from the scope and spirit of the invention.

What is claimed is:

1. An image sensor having a pixel array, wherein the pixel array comprises:
   a plurality of image pixels that gather image data, wherein each image pixel has only a single photodiode covered by only a single microlens;
   a pair of phase detection pixels that gather phase information, wherein the pair of phase detection pixels includes first and second phase detection pixels with different angular responses; and
   a color filter array, wherein the color filter array comprises a plurality of color filter elements formed over the plurality of image pixels, wherein the plurality of color filter elements are arranged according to a color pattern, wherein the first and second phase detection pixels include respective first and second color filter elements having respective first and second colors that match the color pattern, and wherein the color pattern comprises a repeating unit cell of two-by-two color filter elements that is repeated across the entire color filter array.

2. The image sensor defined in claim 1 wherein the first and second color filter elements transmit light of different colors.

3. The image sensor defined in claim 2 further comprising a plurality of additional pairs of phase detection pixels, wherein the pair of phase detection pixels and the plurality of additional pairs of phase detection pixels are located in a pixel row, and wherein each of the additional pairs of phase detection pixels includes color filter elements that transmit light of different colors.

4. The image sensor defined in claim 1 wherein the first and second phase detection pixels include respective first and second photodiodes that are covered by a single microlens.

5. The image sensor defined in claim 1 wherein the first and second phase detection pixels include respective first and second photodiodes that are each partially covered by an opaque shielding layer.

6. The image sensor defined in claim 1 wherein the pixel array comprises pixel rows and pixel columns and wherein the first and second phase detection pixels are located adjacent to one another in one of the pixel rows.

7. The image sensor defined in claim 1 wherein the pixel array comprises pixel rows and pixel columns and wherein the first and second phase detection pixels are located adjacent to one another in one of the pixel columns.

8. The image sensor defined in claim 1 wherein the first phase detection pixel includes a first photodiode covered by a first microlens, wherein the second phase detection pixel includes a second photodiode covered by a second microlens, and wherein the first and second phase detection pixels are positioned diagonally from one another.

9. The image sensor defined in claim 8 wherein the first microlens spans first and second columns of the pixel array and wherein the second microlens is adjacent to the first microlens and also spans the first and second columns of the pixel array.

10. The image sensor defined in claim 8 wherein the first microlens spans first and second columns in the pixel array and wherein the second microlens spans third and fourth columns of the pixel array.

11. An image sensor having a pixel array, wherein the pixel array comprises:
    a plurality of image pixels that gather image data, wherein each image pixel has only a single photodiode covered by only a single microlens;
    pairs of phase detection pixels that gather phase information, wherein each pair of phase detection pixels includes first and second phase detection pixels with different angular responses and wherein each pair of phase detection pixels is completely surrounded by the image pixels and is isolated from the other pairs of phase detection pixels in the pixel array; and
    a color filter array, wherein the color filter array comprises a plurality of color filter elements formed over the pixel array, wherein the plurality of color filter elements are arranged according to a color pattern, wherein the color pattern comprises a repeating unit cell of two-by-two color filter elements, wherein the repeating unit cell of two-by-two color filter elements has two color filter elements of a first color arranged on a first diagonal, and wherein the repeating unit cell of two-by-two image color filter elements has a color filter element of a second color and a color filter element of a third color on a second diagonal, and wherein each pair of phase detection pixels includes respective first and second color filter elements having respective colors that match the color pattern.

12. The image sensor defined in claim 11 wherein the pairs of phase detection pixels are arranged in a row and wherein the pairs of phase detection pixels in the row are separated from each other by image pixels in the row.

13. The image sensor defined in claim 11 wherein the pairs of phase detection pixels include first pairs of phase detection pixels in a first row of the pixel array and second pairs of phase detection pixels in a second row of the pixel array and wherein the first pairs of phase detection pixels are staggered with respect to the second pairs of phase detection pixels.

14. The image sensor defined in claim 11, wherein each image pixel has a symmetric angular response to light.

15. The image sensor defined in claim 11, wherein every pixel in the pixel array has a color filter element that matches the color pattern.

16. The image sensor defined in claim 11, wherein the two color filter elements of the first color are green color filter elements, wherein the color filter element of the second color is a red color filter element, and wherein the color filter element of the third color is a blue color filter element.

17. The image sensor defined in claim 11, wherein the two color filter elements of the first color are broadband color filter elements, wherein the color filter element of the second color is a red color filter element, and wherein the color filter element of the third color is a blue color filter element.

18. An image sensor having a pixel array, wherein the pixel array comprises:
    a plurality of image pixels that gather image data; and
    a pair of phase detection pixels that gather phase information, wherein the pair of phase detection pixels includes first and second phase detection pixels with different angular responses, wherein the first and second phase detection pixels include respective first and second color filter elements, wherein the first and second color filter elements have respective first and second colors, wherein the first color is different from the second color, wherein the first phase detection pixel includes a first photodiode positioned below the first color filter element, wherein the second phase detection pixel includes a second photodiode positioned below the second color filter element, wherein the first photodiode is covered by a microlens, and wherein the second photodiode is also covered by the microlens.

19. The image sensor defined in claim 18 further comprising:
    a plurality of color filter elements formed over the plurality of image pixels, wherein the plurality of color filter elements are arranged according to a color pattern, and wherein the first and second colors match the color pattern.

20. The image sensor defined in claim 19 wherein the color pattern is a Bayer color pattern.

* * * * *